(12) United States Patent
Wang et al.

(10) Patent No.: US 9,287,303 B1
(45) Date of Patent: Mar. 15, 2016

(54) CMOS IMAGE SENSOR STRUCTURE

(71) Applicant: TAIWAN SEMICONDUCTOR MANUFACTURING CO., LTD., Hsinchu (TW)

(72) Inventors: Chiao-Chi Wang, Taoyuan (TW); Chung-Chuan Tseng, Hsinchu (TW); Li-Hsin Chu, New Taipei (TW); Chia-Wei Liu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/622,458

(22) Filed: Feb. 13, 2015

(51) Int. Cl.
*H01L 31/14* (2006.01)
*H01L 27/146* (2006.01)
*H01L 31/113* (2006.01)

(52) U.S. Cl.
CPC ...... *H01L 27/14607* (2013.01); *H01L 27/1463* (2013.01); *H01L 27/14614* (2013.01); *H01L 27/14643* (2013.01); *H01L 27/14685* (2013.01); *H01L 27/14689* (2013.01); *H01L 31/1136* (2013.01)

(58) Field of Classification Search
USPC .......................................................... 257/291
See application file for complete search history.

(56) References Cited

U.S. PATENT DOCUMENTS

| | | | |
|---|---|---|---|
| 6,191,446 B1* | 2/2001 | Gardner et al. ................ | 257/330 |
| 8,129,764 B2* | 3/2012 | Akram ............................ | 257/292 |
| 8,896,030 B2* | 11/2014 | Mukherjee et al. ............ | 257/204 |
| 2011/0012209 A1* | 1/2011 | Kao et al. ....................... | 257/411 |
| 2012/0037967 A1* | 2/2012 | Adkisson et al. .............. | 257/292 |

\* cited by examiner

*Primary Examiner* — Thao P Le
(74) *Attorney, Agent, or Firm* — Maschoff Brennan

(57) ABSTRACT

A semiconductor device includes a substrate, a logic gate structure, a photosensitive gate structure, a hard mask layer, a first spacer, a first source, a first drain, a second spacer, a second source and a second drain. The logic gate structure and the photosensitive gate structure are disposed on a surface of the substrate. The hard mask layer covers the logic gate structure, the photosensitive gate structure and the surface of the substrate. The first spacer overlies the hard mask layer conformal to a sidewall of the logic gate structure. The first source and drain are respectively disposed in the substrate at two opposite sides of the logic gate structure. The second spacer overlies the hard mask layer conformal to a sidewall of the photosensitive gate structure. The second source and drain are respectively disposed in the substrate at two opposite sides of the photosensitive gate structure.

20 Claims, 8 Drawing Sheets

CMOS IMAGE SENSOR STRUCTURE

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

As CMOS image sensor technologies are rapidly developed, economical processes for manufacturing CMOS image sensors with higher image quality are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
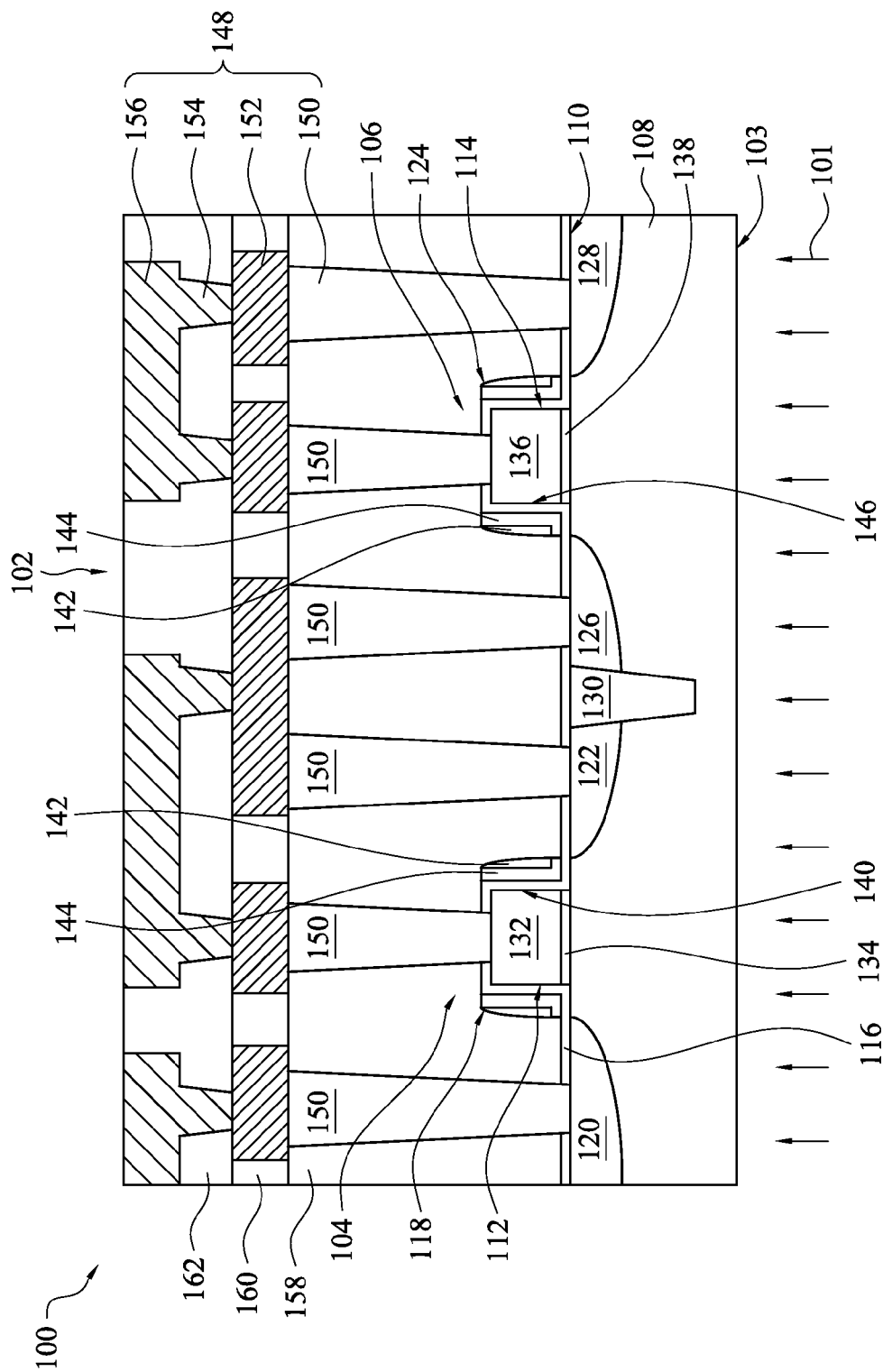
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in its elf dictate a relationship between the various embodiments and/or configurations discussed. As used herein, the term "and/or" includes any and all combinations of one or more of the associated listed items.

In a typical process for manufacturing a CMOS image sensor, a spacer material layer including an upper layer and a bottom hard mask layer is first formed to cover a substrate, a logic gate structure in a logic region on the substrate and a photosensitive gate structure in a photosensitive region on the substrate, and then a spacer etching operation is performed on the spacer material layer to form spacers respectively conformal to sidewalls of the logic gate structure and the photosensitive gate structure. After the spacer etching operation, an additional photolithography operation and an additional etching operation are performed to remove a portion of the bottom hard mask layer in the logic region, and to remain the other portion of the hard mask layer in the photosensitive region for preventing a surface of the substrate in the photosensitive region from being damaged during a subsequent source/drain implantation operation. However, due to the additional photolithography operation and the additional etching operation, the process for manufacturing the CMOS image sensor becomes complex, time-consuming and costly.

Embodiments of the present disclosure are directed to providing a semiconductor device and a method for manufacturing the semiconductor device, in which by controlling parameters of an operation for forming sources and drains of a logic device and a photosensitive device of the semiconductor device, pixel performance of the semiconductor device can be maintained while a portion of a hard mask layer in a logic region is kept during the operation. Thus, an additional photolithography operation and an additional etching operation for removing the portion of the hard mask layer in the logic region are not needed, thereby simplifying a process for manufacturing the semiconductor device, decreasing process time and reducing process cost.

FIG. 1 is a schematic cross-sectional view of a semiconductor device in accordance with various embodiments. In some embodiments, a semiconductor device 100 is a CMOS image sensor device, which may be operated for sensing incident light 101. The semiconductor device 100 has a front side 102 and a back side 103. In some exemplary examples, as shown in FIG. 1, the semiconductor device 100 is a back-side illuminated (BSI) CMOS image sensor device, which is operated to sense the incident light 101 projected from its back side 103. The semiconductor device 100 may include at least one logic device 104 and at least one photosensitive device 106. In some examples, the semiconductor device 100 includes a substrate 108, a logic gate structure 112 of the logic device 104, a photosensitive gate structure 114 of the photosensitive device 106, a hard mask layer 116, a first spacer 118, a first source 120 and a first drain 122 of the logic device 104, a second spacer 124, and a second source 126 and a second drain 128 of the photosensitive device 106.

The substrate 108 may be a semiconductor substrate. In some examples, the substrate 108 is composed of a single-crystalline semiconductor material or a compound semiconductor material. For example, silicon or germanium may be used as a material of the substrate 108. In some examples, an isolation structure 130 is formed in the substrate 108 and extends from a surface 110 of the substrate 108, in which the isolation structure 130 is disposed between the logic device 104 and the photosensitive device 106 for electrically isolating the logic device 104 and the photosensitive device 106. The isolation structure 130 may be a shallow trench isolation (STI) structure. For example, the isolation structure 130 may be formed from silicon dioxide.

The logic gate structure 112 is disposed on the surface 110 of the substrate 108. As shown in FIG. 1, the logic gate structure 112 includes a gate electrode 132 and a gate dielectric layer 134, in which the gate dielectric layer 134 is disposed on the surface 110 of the substrate 108, and the gate electrode 132 is stacked on the gate dielectric layer 134. In some examples, the gate dielectric layer 134 is formed from silicon dioxide, and the gate electrode 132 is formed from polysilicon or metal.

As shown in FIG. 1, the photosensitive gate structure 114 is disposed on the surface 110 of the substrate 108. The photosensitive gate structure 114 includes a gate electrode 136 and a gate dielectric layer 138, in which the gate dielectric layer 138 is disposed on the surface 110 of the substrate 108, and the gate electrode 136 is stacked on the gate dielectric layer 138. In some examples, the gate dielectric layer 138 is formed from silicon dioxide, and the gate electrode 136 is formed from polysilicon or metal.

The hard mask layer 116 covers the logic gate structure 112, the photosensitive gate structure 114 and the surface 110 of the substrate 108. The hard mask layer 116 may be formed from a dielectric material, such as silicon dioxide. In some exemplary examples, a thickness of the hard mask layer 116 is about 190 angstroms. The first spacer 118 overlies the hard mask layer 116 and is conformal to a sidewall 140 of the logic gate structure 112. In some examples, as shown in FIG. 1, the first spacer 118 includes a stacked structure, in which the stacked structure includes a first layer 142 and a second layer 144 on which the first layer 142 is stacked. For example, the second layer 144 is a silicon nitride layer on the hard mask layer 116, and the first layer 142 is a silicon dioxide layer stacked on the second layer 144 while the hard mask layer 116 is a silicon dioxide layer, i.e. the first layer 142, the second layer 144 and the hard mask layer 116 form an ONO (oxide-nitride-oxide) structure. In certain examples, the first spacer 118 is a single-layered structure, and the first spacer 118 may be formed from silicon nitride while the hard mask layer 116 is formed from silicon dioxide.

The second spacer 124 overlies the hard mask layer 116 and is conformal to a sidewall 146 of the photosensitive gate structure 114. In some examples, as shown in FIG. 1, the second spacer 124 includes the same stacked structure as the first spacer 112, in which the stacked structure includes the first layer 142 and the second layer 144, and the first layer 142 is stacked on the second layer 144. Similarly, in the second spacer 124, the second layer 144 is a silicon nitride layer on the hard mask layer 116, and the first layer 142 is a silicon dioxide layer stacked on the second layer 144 while the hard mask layer 116 is a silicon dioxide layer. In certain examples, the second spacer 124 is a single-layered structure, and the second spacer 124 may be formed from silicon nitride while the hard mask layer 116 is formed from silicon dioxide.

Referring to FIG. 1 again, the first source 120 and the first drain 122 are formed in the substrate 108, and are respectively disposed at two sides of the logic gate structure 112. The first source 120 and the first drain 122 are respectively at two outer sides of the first spacer 118. The first source 120 and the first drain 122 are doped regions of the substrate 108, and the hard mask layer 116 covers the first source 120 and the first drain 122. The second source 126 and the second drain 128 are formed in the substrate 108, and are respectively disposed at two sides of the photosensitive gate structure 114. The second source 126 and the second drain 128 are respectively at two outer sides of the second spacer 124. The second source 126 and the second drain 128 are doped regions of the substrate 108, and the hard mask layer 116 covers the second source 126 and the second drain 128. As shown in FIG. 1, the isolation structure 130 is disposed between the first drain 122 of the logic device 104 and the second source 126 of the photosensitive device 106.

In some examples, the semiconductor device 100 further includes an interconnection layer 148 which is disposed over the surface 110 of the substrate 108 and is electrically connected to the gate electrode 132 of the logic gate structure 112, the gate electrode 136 of the photosensitive gate structure 114, the first source 120 and the first drain 122 of the logic device 104, and the second source 126 and the second drain 128 of the photosensitive device 106 after passing through the hard mask layer 116. For example, as shown in FIG. 1, the interconnection layer 148 may include various contacts 150, various connection layers 152, various vias 154 and various connection layers 156. The contacts 150 pass through the hard mask layer 116 and are electrically connected to the gate electrode 132, the first source 120 and the first drain 122 of the logic device 104, and the gate electrode 136, the second source 126 and the second drain 128 of the photosensitive device 106 respectively. The connection layers 152 are disposed on the contacts 150 and are electrically connected to the contacts 150. The connection layers 156 are disposed over the connection layers 152, and the vias 154 are disposed between the connection layers 152 and 154, and electrically connect the connection layers 152 and 154. In some examples, the contacts 150, the connection layers 152, the vias 154 and the connection layers 156 are formed from metal, such as copper (Cu).

In some examples, the semiconductor device 100 further includes dielectric layers 158, 160 and 162 which are stacked on the surface 110 of the substrate 108 in sequence. The dielectric layer 158 overlies and covers the hard mask layer 116, the first spacer 118 and the second spacer 124, and the contacts 150 are formed in the dielectric layer 158 and pass through the dielectric layer 158. The dielectric layer 160 overlies and covers the dielectric layer 158 and the contacts 150, and the connection layers 152 are formed in the dielectric layer 160 and pass through the dielectric layer 160. The dielectric layer 162 overlies and covers the dielectric layer 160 and the connection layers 152, in which the vias 154 and the connection layers 156 are formed in the dielectric layer 162, and combinations of the connection layers 156 and the vias 154 pass through the dielectric layer 162. For example, the dielectric layers 158, 160 and 162 may be formed from silicon dioxide.

Figure 2A:
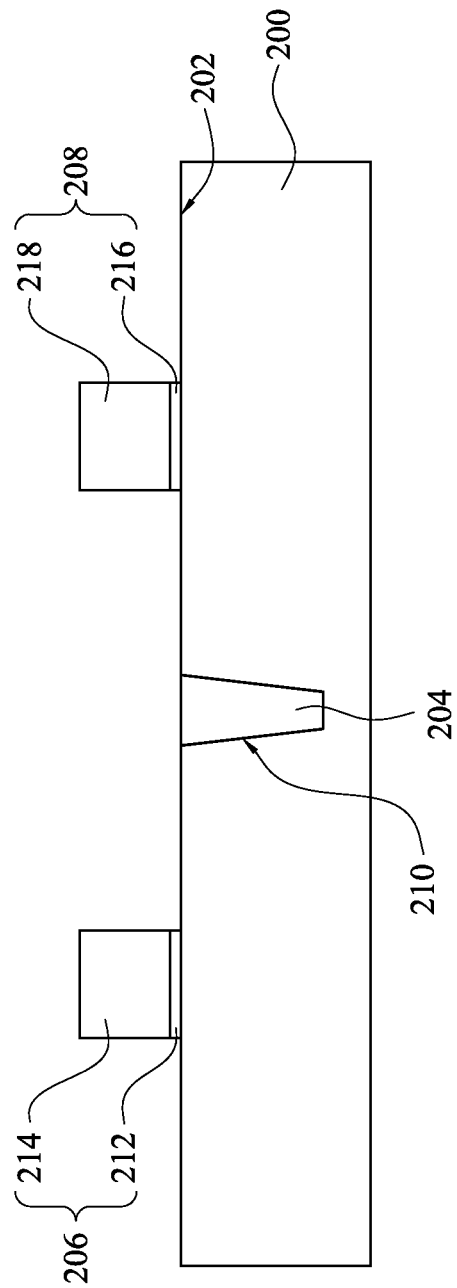
FIG. 2A through FIG. 2E are schematic cross-sectional views of intermediate stages showing a method for manufacturing a semiconductor device in accordance with various embodiments.

Referring to FIG. 2A through FIG. 2E, FIG. 2A through FIG. 2E are schematic cross-sectional views of intermediate stages showing a method for manufacturing a semiconductor device in accordance with various embodiments. As shown in FIG. 2A, a substrate 200 is provided. In some examples, the substrate 200 may be a semiconductor substrate and may be composed of a single-crystalline semiconductor material or a compound semiconductor material. For example, silicon or germanium may be used as a material of the substrate 200. In some examples, the operation of providing the substrate 200 includes providing the substrate 200 with at least one isolation structure 204, in which the isolation structure 204 is formed in the substrate 200 and extends from a surface 202 of the substrate 200. The isolation structure 204 is formed between a logic gate structure 206 and a photosensitive gate structure 208, which are subsequently formed, for electrically isolating the logic gate structure 206 and the photosensitive gate structure 208. The isolation structure 204 may be a shallow trench isolation structure. In some exemplary examples, the operation of forming the isolation structure 204 includes forming a trench 210 in the substrate 200, and filling the trench 210 with a dielectric material, so as to form the isolation structure 204 in the trench 210. For example, the isolation structure 210 may be formed from silicon dioxide.

A logic gate structure 206 and a photosensitive gate structure 208 are formed on the surface 202 of the substrate 200. In some examples, as shown in FIG. 2A, the operation of forming the logic gate structure 206 is performed to form the logic gate structure 206 including a gate dielectric layer 212 and a gate electrode 214, in which the gate dielectric layer 212 is disposed on the surface 202 of the substrate 200, and the gate electrode 214 is stacked on the gate dielectric layer 212. In some exemplary examples, the gate dielectric layer 212 is formed from silicon dioxide, and the gate electrode 214 is formed from polysilicon or metal. Referring to FIG. 2A again, the operation of forming the photosensitive gate structure 208 is performed to form the photosensitive gate structure 208 including a gate dielectric layer 216 and a gate electrode 218, in which the gate dielectric layer 216 is disposed on the surface 202 of the substrate 200, and the gate electrode 218 is stacked on the gate dielectric layer 216. In some exemplary examples, the gate dielectric layer 216 is formed from silicon dioxide, and the gate electrode 218 is formed from polysilicon or metal.

In some examples, the logic gate structure 206 and the photosensitive gate structure 208 are simultaneously formed on the surface 202 of the substrate 200. In the operation of forming the logic gate structure 206 and the photosensitive gate structure 208 includes forming a gate dielectric material layer to cover the surface 202 of the substrate 200, forming a gate electrode material layer to cover the gate dielectric material layer, and removing a portion of the gate dielectric material layer and a portion of the gate electrode material layer to respectively form the gate dielectric layers 212 and 216 and the gate electrodes 214 and 218. Thus, the logic gate structure 206 including the gate dielectric layer 212 and the gate electrode 214, and the photosensitive gate structure 208 including the gate dielectric layer 216 and the gate electrode 218 are formed. In such examples, the gate dielectric layers 212 and 216 are formed from the same material, and the gate electrodes 214 and 218 are formed from the same material. For example, the operation of the gate dielectric material layer may be performed using a thermal oxidation technique or a deposition technique, and the operation of the gate electrode material layer may be performed using a deposition technique.

Figure 2B:
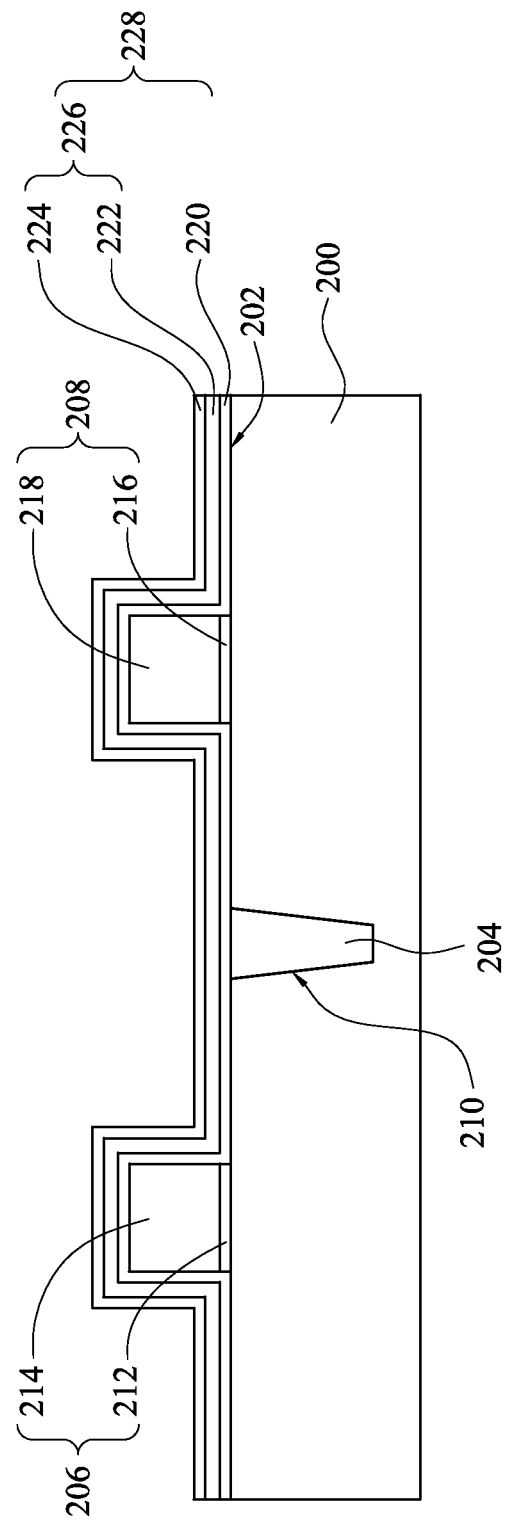

As shown in FIG. 2B, a multi-layered structure 228 is formed to cover the logic gate structure 206, the photosensitive gate structure 208 and the surface 202 of the substrate 200 by using, for example, a deposition technique. The operation of forming the multi-layered structure 228 may be performed using a chemical vapor deposition (CVD) technique. In some examples, the operation of forming the multi-layered structure 228 is performed to form the multi-layered structure 228 including a hard mask layer 220 and a spacer material layer 226. The hard mask layer 220 is formed to cover the logic gate structure 206, the photosensitive gate structure 208 and the surface 202 of the substrate 200, and the spacer material layer 226 is formed to cover the hard mask layer 220.

In some examples, the operation of forming the hard mask layer 220 includes forming the hard mask layer 220 from a dielectric material, such as silicon dioxide. For example, the hard mask layer 220 may be formed to have a thickness which is about 190 angstroms. In some examples, the operation of forming the spacer material layer 226 is performed to form the spacer material layer 226 including a stacked structure. For example, as shown in FIG. 2B, the stacked structure of the spacer material layer 226 includes two layers which are respectively an intermediate layer 222 and a top layer 224 stacked on the intermediate layer 222, such that the multi-layered structure 228 includes three layers which are respectively a bottom layer (i.e. the hard mask layer 220), the intermediate layer 222 and the top layer 224 stacked on the surface 202 of the substrate 200 in sequence. The operation of forming the spacer material layer 226 includes forming the intermediate layer 222 and the top layer 224 from different dielectric materials. In some exemplary examples, the operation of forming the spacer material layer 226 includes forming the intermediate layer 222 from silicon nitride, and forming the top layer 224 from silicon dioxide while the hard mask layer 220 is formed from silicon dioxide, i.e. the operation of forming the multi-layered structure 228 is performed to form the multi-layered structure 228 including an ONO structure.

In certain examples, the operation of forming the spacer material layer 226 is performed to form the spacer material layer 226 including a single-layered structure. For example, the operation of the spacer material layer 226 includes forming the spacer material layer 226 from silicon nitride while the hard mask layer 220 is formed from silicon dioxide.

Figure 2C:
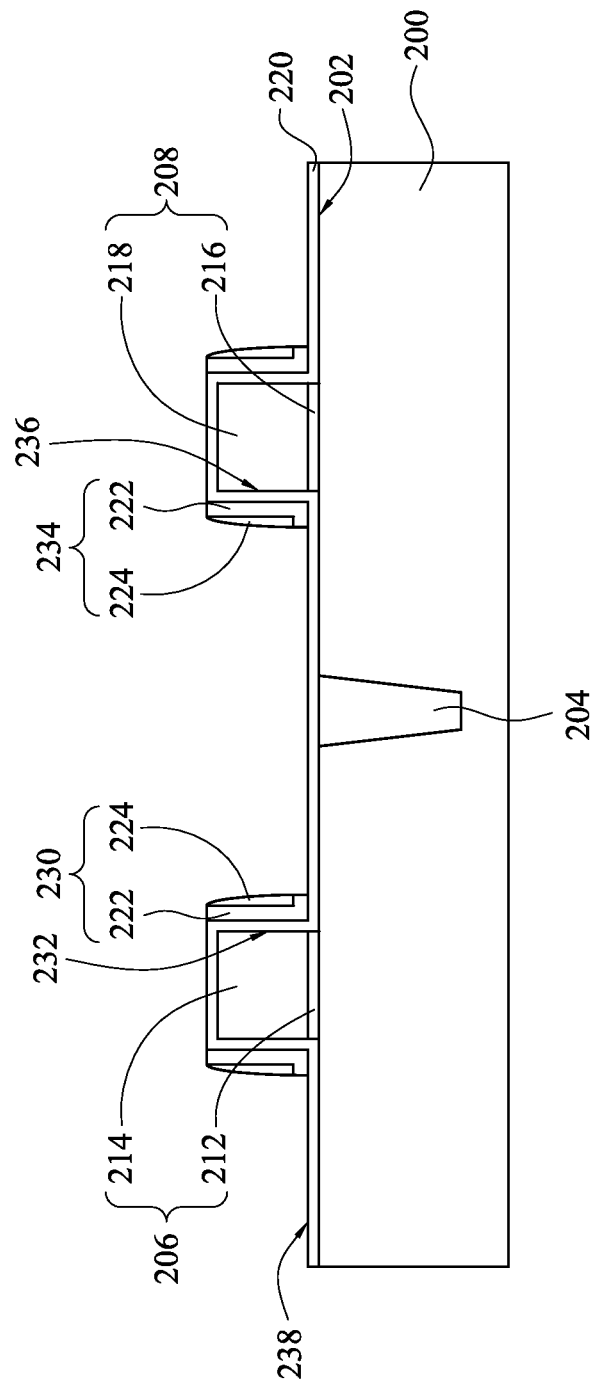

Referring to FIG. 2B and FIG. 2C simultaneously, a portion of the spacer material layer 226 is removed to expose a portion 238 of the hard mask layer 220 by using an etching technique, such as a dry etching technique. In the operation of removing the portion of the spacer material layer 226 is performed to remain the other portion of the spacer material layer 226 for forming a first spacer 230 overlying the hard mask layer 220 conformal to a sidewall 232 of the logic gate structure 206 and a second spacer 234 overlying the hard mask layer 220 conformal to a sidewall 236 of the photosensitive gate structure 208. Thus, the first spacer 230 includes a portion of the spacer material layer 226 conformal to the sidewall 232 of the logic gate structure 206, and the second spacer 234 includes another portion of the spacer material layer 226 conformal to the sidewall 236 of the photosensitive gate structure 208. In some examples, as shown in FIG. 2C, the operation of removing the portion of the spacer material layer 226 is performed to remove a portion of the top layer 224 and a portion of the intermediate layer 222, so as to expose the underlying hard mask layer 220. In such examples, as shown in FIG. 2C, each of the first spacer 230 and the second spacer 234 is formed to include the intermediate layer 222 and the top layer 224.

Figure 2D:
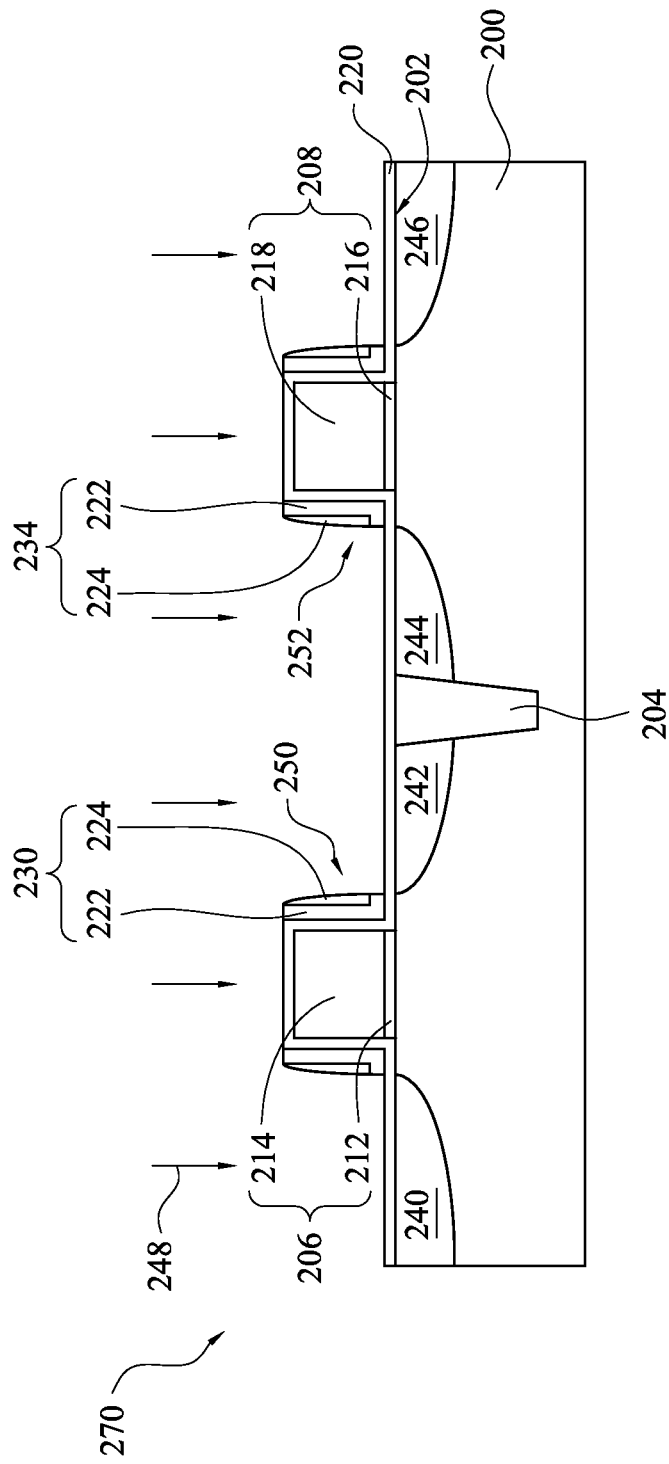

As shown in FIG. 2D, a first source 240 and a first drain 242 are respectively formed in the substrate 200 at two opposite sides of the logic gate structure 206, and a second source 244 and a second drain 246 are respectively formed in the substrate 200 at two opposite sides of the photosensitive gate structure 208, so as to substantially complete a semiconductor device 270. In addition, the first source 240 and the first drain 242 are formed respectively at two outer sides of the first spacer 230, and the second source 244 and the second drain 246 are formed respectively at two outer sides of the second spacer 234. In some examples, the operation of forming the first source 240, the first drain 242, the second source 244 and the second drain 246 are performed using an implantation process 248 with the hard mask layer 220 masking the surface 202 of the substrate 200. The first source 240, the first drain 242, the second source 244 and the second drain 246 are doped regions in the substrate 200. After the first source 240, the first drain 242, the second source 244 and the second drain 246 are formed, a logic device 250 including the logic gate structure 206, the first source 240 and the first drain 242 and a photosensitive device 252 including the photosensitive gate structure 208, the second source 244 and the second drain 246 are substantially completed. As shown in FIG. 2D, the isolation structure 204 is disposed between the first drain 242 of the logic device 250 and the second source 244 of the photosensitive device 252 for electrically isolating the logic device 250 and the photosensitive device 252.

In some exemplary examples, the implantation process 248 for forming the first source 240, the first drain 242, the second source 244 and the second drain 246 includes forming each of the first source 240, the first drain 242, the second source 244 and the second drain 246 with an N-type. For example, such implantation process 248 for forming the first source 240, the first drain 242, the second source 244 and the second drain 246 may be performed with an implantation energy from 20 keV to 40 keV. In various exemplary examples, the implantation process 248 for forming the first source 240, the first drain 242, the second source 244 and the second drain 246 includes forming each of the first source 240, the first drain 242, the second source 244 and the second drain 246 with a P-type. For example, such implantation process 248 for forming the first source 240, the first drain 242, the second source 244 and the second drain 246 may be performed with an implantation energy from 7 keV to 25 keV.

With the hard mask layer 220 masking the surface 202 of the substrate 200 during the implantation process 248, it can prevent the surface 202 of the substrate 200 in a photosensitive region on which the photosensitive device 252 is formed from being damaged, such that electrons will not be trapped by the surface 202 of the substrate 200, thereby preventing a current leakage effect from occurring during photography to eliminate a white pixel effect and a dark current effect. Thus, image quality of the semiconductor device 270 is enhanced. Furthermore, by controlling parameters of the implantation process 248, the portion of the hard mask layer 220 in a logic region on which the logic device 250 is formed needs not to be removed while pixel performance of semiconductor device 270 is kept. Thus, an additional photolithography operation and an additional etching operation for removing the portion of the hard mask layer 220 in the logic region are not needed, thereby simplifying a process for manufacturing the semiconductor device 270, decreasing process time and reducing process cost.

Figure 2E:
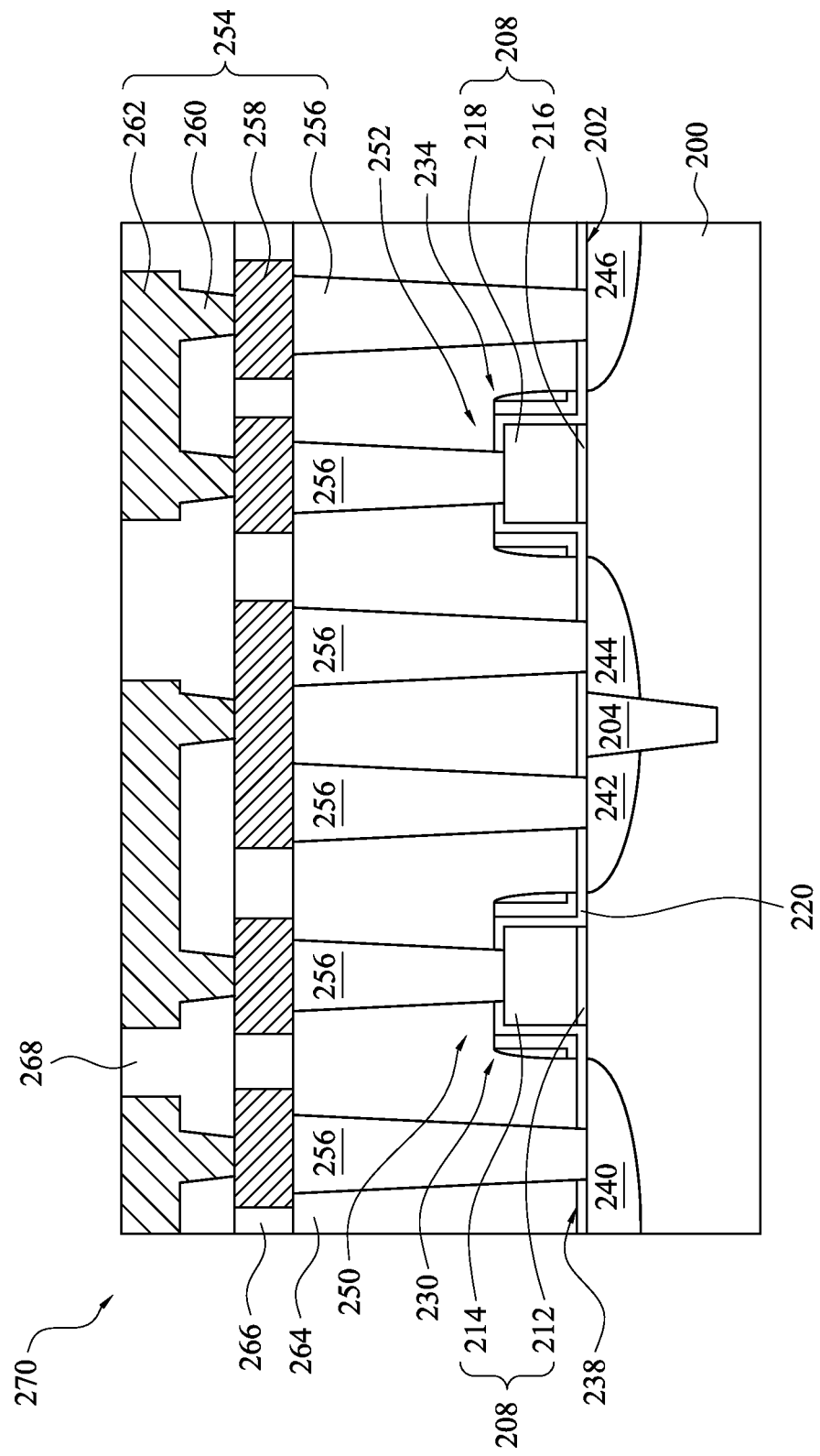

After the operation of forming the first source 240, the first drain 242, the second source 244 and the second drain 246 is completed, at least one dielectric layer may be optionally formed to cover the portion 238 of the hard mask layer 220, the first spacer 230 and the second spacer 234 using, for example, a deposition technique. In some examples, as shown in FIG. 2E, the operation of forming the at least one dielectric layer is performed to form the at least one dielectric layer including dielectric layers 264, 266 and 268, in which the dielectric layers 264, 266 and 268 are stacked on the surface 202 of the substrate 200 in sequence. For example, the dielectric layers 264, 266 and 268 may be formed from silicon dioxide. In addition, an interconnection layer 254 may be optionally formed in the dielectric layers 264, 266 and 268 and may be electrically connected to the logic gate structure 206, the photosensitive gate structure 208, the first source 240, the first drain 242, the second source 244 and the second drain 246 after passing through the hard mask layer 220. In some examples, as shown in FIG. 2E, the operation of forming the interconnection layer 254 is performed to form the interconnection layer 254 including various contacts 256, various connection layers 258, various vias 260 and various connection layers 262. For example, the contacts 256, the connection layers 258, the vias 260 and the connection layers 262 are formed from metal, such as copper.

Referring to FIG. 2E again, in some exemplary examples, the operation of forming the dielectric layer 264 includes forming the dielectric layer 264 overlying and covering the hard mask layer 220, the first spacer 230 and the second spacer 234. After the dielectric layer 264 is formed, the operation of forming the contacts 256 is performed to form the contacts 256 in the dielectric layer 256 and passing through the dielectric layer 256 and the hard mask layer 220 to electrically connect to the gate electrode 214, the first source 240 and the first drain 242 of the logic device 250, and the gate electrode 218, the second source 244 and the second drain 246 of the photosensitive device 252 respectively. The operation of forming the contacts 256 may be performed using a damascene technique.

After the contacts 256 are formed, the operation of forming the dielectric layer 266 is performed to form the dielectric layer 266 overlying and covering the dielectric layer 264 and the contacts 256. Then, the operation of forming the connection layers 258 is performed to form the connection layers 258 in the dielectric layer 266, in which the connection layers 258 are formed to pass through the dielectric layer 266 and to electrically connect to the contacts 256 correspondingly. The operation of forming the connection layers 258 may be performed using a damascene technique. After the operation of forming the connection layers 258 is completed, the operation of forming the dielectric layer 268 is performed to form the dielectric layer 268 overlying and covering the dielectric layer 266 and the connection layers 258. After the dielectric layer 268 is formed, the vias 260 and the connection layers 262, which are corresponding to each other, are formed in the dielectric layer 268 and combinations of the connection layers 262 and the vias 260 pass through the dielectric layer 268. The operation of forming the connection layers 262 includes forming the connection layers 262 overlying the connection layers 258, and the operation of forming the vias 260 includes forming the vias 260 located between the connection layers 262 and 258, and electrically connecting the connection layers 262 and 258. The operation of forming the connection layers 262 and the vias 260 may be performed using a dual damascene technique.

Figure 3:
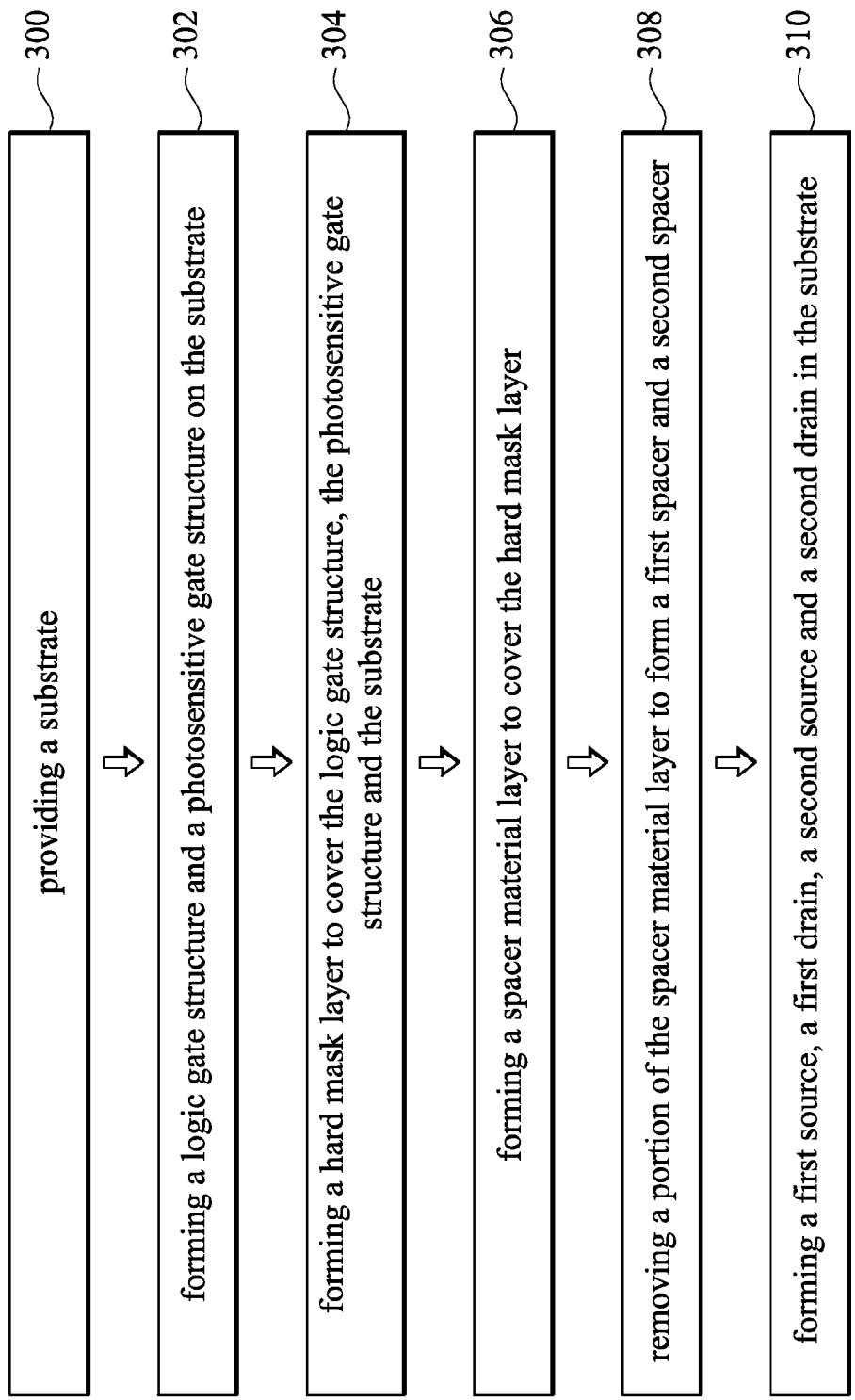
FIG. 3 is a flow chart of a method for manufacturing a semiconductor device in accordance with various embodiments.

Referring to FIG. 3 with FIG. 2A through FIG. 2E, FIG. 3 is a flow chart of a method for manufacturing a semiconductor device in accordance with various embodiments. The method begins at operation 300, where a substrate 200 is provided. The substrate 200 may be a semiconductor substrate and may be composed of a single-crystalline semiconductor material or a compound semiconductor material. In some examples, the operation of providing the substrate 200 includes providing the substrate 200 with at least one isolation structure 204, in which the isolation structure 204 is formed in the substrate 200 and extends from a surface 202 of the substrate 200. The isolation structure 204 is formed between a logic gate structure 206 and a photosensitive gate structure 208, which are subsequently formed, for electrically isolating the logic gate structure 206 and the photosensitive gate structure 208. The isolation structure 204 may be a shallow trench isolation structure. For example, the operation of forming the isolation structure 204 includes forming a trench 210 in the substrate 200, and filling the trench 210 with a dielectric material, so as to form the isolation structure 204 in the trench 210.

At operation 302, referring to FIG. 2A again, a logic gate structure 206 and a photosensitive gate structure 208 are formed on the surface 202 of the substrate 200. In some examples, the operation of forming the logic gate structure 206 is performed to form the logic gate structure 206 including a gate dielectric layer 212 and a gate electrode 214 stacked on the gate dielectric layer 212. The operation of forming the photosensitive gate structure 208 is performed to form the photosensitive gate structure 208 including a gate dielectric layer 216 and a gate electrode 218 stacked on the gate dielectric layer 216. In some examples, the logic gate structure 206 and the photosensitive gate structure 208 are simultaneously formed on the surface 202 of the substrate 200. In the operation of forming the logic gate structure 206 and the photosensitive gate structure 208 includes forming a gate dielectric material layer to cover the surface 202 of the substrate 200, forming a gate electrode material layer to cover the gate dielectric material layer, and removing a portion of the gate dielectric material layer and a portion of the gate electrode material layer to respectively form the gate dielectric layers 212 and 216 and the gate electrodes 214 and 218, so as to form the logic gate structure 206 and the photosensitive gate structure 208.

At operation 304, as shown in FIG. 2B, a hard mask layer 220 is formed to cover the logic gate structure 206, the photosensitive gate structure 208 and the surface 202 of the substrate 200 using, for example, a deposition technique. In some examples, the operation of forming the hard mask layer 220 includes forming the hard mask layer 220 from a dielectric material, such as silicon dioxide. For example, the hard mask layer 220 may be formed to have a thickness which is about 190 angstroms.

At operation 306, referring to FIG. 2B again, a spacer material layer 226 is formed to cover the hard mask layer 220 using, for example, a deposition technique. In some examples, the operation of forming the spacer material layer 226 is performed to form the spacer material layer 226 including a stacked structure. For example, the stacked structure of the spacer material layer 226 includes an intermediate layer 222 and a top layer 224 stacked on the intermediate layer 222. The operation of forming the spacer material layer 226 includes forming the intermediate layer 222 and the top layer 224 from different dielectric materials. In some exemplary examples, the operation of forming the spacer material layer 226 includes forming the intermediate layer 222 from silicon nitride and forming the top layer 224 from silicon dioxide while the hard mask layer 220 is formed from silicon dioxide. In certain examples, the operation of forming the spacer material layer 226 is performed to form the spacer material layer 226 including a single-layered structure.

At operation 308, as shown in FIG. 2B and FIG. 2C, a portion of the spacer material layer 226 is removed to expose a portion 238 of the hard mask layer 220 and to form a first spacer 230 overlying the hard mask layer 220 conformal to a sidewall 232 of the logic gate structure 206 and a second spacer 234 overlying the hard mask layer 220 conformal to a sidewall 236 of the photosensitive gate structure 208. The operation of removing the portion of the spacer material layer 226 may be performed using an etching technique, such as a dry etching technique. Each of the first spacer 230 and the second spacer 234 includes a portion of the spacer material layer 226.

At operation 310, as shown in FIG. 2D, a first source 240 and a first drain 242 are respectively formed in the substrate 200 at two opposite sides of the logic gate structure 206, and a second source 244 and a second drain 246 are respectively formed in the substrate 200 at two opposite sides of the photosensitive gate structure 208 using, for example, an implantation process 248, so as to substantially complete a logic device 250 and a photosensitive device 252 of a semiconductor device 270. The first source 240 and the first drain 242 are formed respectively at two outer sides of the first spacer 230, and the second source 244 and the second drain 246 are formed respectively at two outer sides of the second spacer 234. In some examples, the implantation process 248 is performed with the hard mask layer 220 masking the surface 202 of the substrate 200. As shown in FIG. 2D, the isolation structure 204 is disposed between the first drain 242 of the logic device 250 and the second source 244 of the photosensitive device 252.

In some exemplary examples, the implantation process 248 includes forming each of the first source 240, the first drain 242, the second source 244 and the second drain 246 with an N-type and with an implantation energy from 20 keV to 40 keV. In various exemplary examples, the implantation process 248 includes forming each of the first source 240, the first drain 242, the second source 244 and the second drain 246 with a P-type and with an implantation energy from 7 keV to 25 keV.

Optionally, at least one dielectric layer may be formed to cover the portion 238 of the hard mask layer 220, the first spacer 230 and the second spacer 234 using, for example, a deposition technique. In some examples, as shown in FIG. 2E, the operation of forming the at least one dielectric layer is performed to form the at least one dielectric layer including dielectric layers 264, 266 and 268 stacked on the surface 202 of the substrate 200 in sequence. In addition, an interconnection layer 254 may be optionally formed in the dielectric layers 264, 266 and 268 and may be electrically connected to the logic gate structure 206, the photosensitive gate structure 208, the first source 240, the first drain 242, the second source 244 and the second drain 246 after passing through the hard mask layer 220. In some examples, as shown in FIG. 2E, the operation of forming the interconnection layer 254 is performed to form the interconnection layer 254 including various contacts 256, various connection layers 258, various vias 260 and various connection layers 262.

In some exemplary examples, the dielectric layer 264 is formed to overlie and cover the hard mask layer 220, the first spacer 230 and the second spacer 234. The contacts 256 are formed in the dielectric layer 256 and passing through the dielectric layer 256 and the hard mask layer 220 to electrically connect to the gate electrode 214, the first source 240 and the first drain 242 of the logic device 250, and the gate electrode 218, the second source 244 and the second drain 246 of the photosensitive device 252 respectively. The contacts 256 may be formed using a damascene technique. Next, the dielectric layer 266 is formed to overlie and cover the dielectric layer 264 and the contacts 256. Then, the connection layers 258 are formed in the dielectric layer 266 and passing through the dielectric layer 266 to electrically connect to the contacts 256 correspondingly using, for example, a damascene technique. The dielectric layer 268 is formed to overlie and cover the dielectric layer 266 and the connection layers 258. Subsequently, the vias 260 and the connection layers 262, which are corresponding to each other, are formed in the dielectric layer 268 using, for example, a dual damascene technique. Combinations of the connection layers 262 and the vias 260 pass through the dielectric layer 268, in which the connection layers 262 overlie the connection layers 258, and the vias 260 connect the connection layers 262 and 258.

Figure 4:
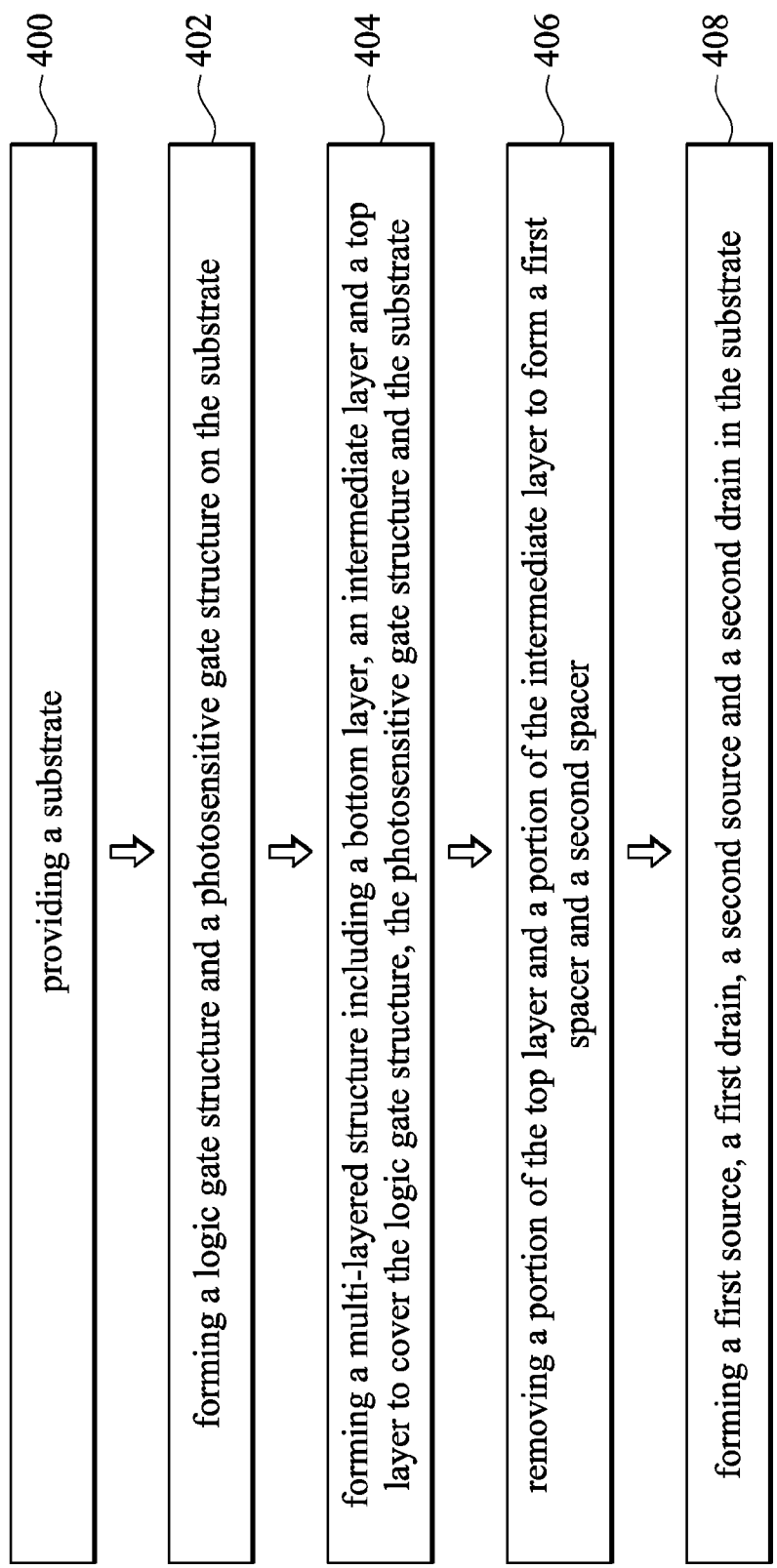
FIG. 4 is a flow chart of a method for manufacturing a semiconductor device in accordance with various embodiments.

Referring to FIG. 4 with FIG. 2A through FIG. 2E, FIG. 4 is a flow chart of a method for manufacturing a semiconductor device in accordance with various embodiments. The method begins at operation 400, where a substrate 200 is provided. The substrate 200 may be a semiconductor substrate and may be composed of a single-crystalline semiconductor material or a compound semiconductor material. In some examples, the substrate 200 is formed to include at least one isolation structure 204, in which the isolation structure 204 is formed in the substrate 200 and extends from a surface 202 of the substrate 200. The isolation structure 204 is formed between a logic gate structure 206 and a photosensitive gate structure 208, which are subsequently formed, for electrically isolating the logic gate structure 206 and the photosensitive gate structure 208. The isolation structure 204 may be a shallow trench isolation structure. The operation of forming the isolation structure 204 includes forming a trench 210 in the substrate 200, and filling the trench 210 with a dielectric material, so as to form the isolation structure 204 in the trench 210.

At operation 402, referring to FIG. 2A again, a logic gate structure 206 and a photosensitive gate structure 208 are formed on the surface 202 of the substrate 200, in which the logic gate structure 206 may include a gate dielectric layer 212 and a gate electrode 214 stacked on the gate dielectric layer 212, and the photosensitive gate structure 208 may include a gate dielectric layer 216 and a gate electrode 218 stacked on the gate dielectric layer 216. In the operation of forming the logic gate structure 206 and the photosensitive gate structure 208 includes forming a gate dielectric material layer to cover the surface 202 of the substrate 200, forming a gate electrode material layer to cover the gate dielectric material layer, and removing a portion of the gate dielectric material layer and a portion of the gate electrode material layer to respectively form the gate dielectric layers 212 and 216 and the gate electrodes 214 and 218, so as to form the logic gate structure 206 and the photosensitive gate structure 208.

At operation 404, as shown in FIG. 2B, a multi-layered structure 228 is formed to cover the logic gate structure 206, the photosensitive gate structure 208 and the surface 202 of the substrate 200 by using, for example, a deposition technique. In some examples, the multi-layered structure 228 is formed to include a hard mask layer 220 and a spacer material layer 226. The hard mask layer 220 is formed to cover the logic gate structure 206, the photosensitive gate structure 208 and the surface 202 of the substrate 200, and the spacer material layer 226 is formed to cover the hard mask layer 220. In some examples, the operation of forming the hard mask layer 220 includes forming the hard mask layer 220 from a dielectric material, such as silicon dioxide. For example, the hard mask layer 220 may be formed to have a thickness which is about 190 angstroms.

In some examples, the operation of forming the spacer material layer 226 is performed to form the spacer material layer 226 including a stacked structure. For example, the stacked structure of the spacer material layer 226 includes an intermediate layer 222 and a top layer 224 stacked on the hard mask layer 220 in sequence, such that the multi-layered structure 228 includes a bottom layer (i.e. the hard mask layer 220), the intermediate layer 222 and the top layer 224 stacked on the surface 202 of the substrate 200 in sequence. In some exemplary examples, the operation of forming the multi-layered structure 228 includes forming the hard mask layer 220 from silicon dioxide, forming the intermediate layer 222 from silicon nitride and forming the top layer 224 from silicon dioxide.

At operation 406, as shown in FIG. 2B and FIG. 2C, a portion of the top layer 224 and a portion of the intermediate layer 222 are removed to expose a portion 238 of the hard mask layer 220 and to form a first spacer 230 overlying the hard mask layer 220 conformal to a sidewall 232 of the logic gate structure 206 and a second spacer 234 overlying the hard mask layer 220 conformal to a sidewall 236 of the photosensitive gate structure 208. The operation of removing the portion of the top layer 224 and the portion of the intermediate layer 222 may be performed using an etching technique, such as a dry etching technique. Each of the first spacer 230 and the second spacer 234 includes a portion of the top layer 224 and a portion of the intermediate layer 222.

At operation 408, as shown in FIG. 2D, a first source 240 and a first drain 242 are respectively formed in the substrate 200 at two opposite sides of the logic gate structure 206, and a second source 244 and a second drain 246 are respectively formed in the substrate 200 at two opposite sides of the photosensitive gate structure 208 using, for example, an implantation process 248, so as to substantially complete a logic device 250 and a photosensitive device 252 of a semiconductor device 270. The first source 240 and the first drain 242 are formed respectively at two outer sides of the first spacer 230, and the second source 244 and the second drain 246 are formed respectively at two outer sides of the second spacer 234. In some examples, the implantation process 248 is performed with the hard mask layer 220 masking the surface 202 of the substrate 200. As shown in FIG. 2D, the isolation structure 204 is disposed between the first drain 242 of the logic device 250 and the second source 244 of the photosensitive device 252.

In some exemplary examples, the implantation process 248 includes forming each of the first source 240, the first drain 242, the second source 244 and the second drain 246 with an N-type and with an implantation energy from 20 keV to 40 keV. In various exemplary examples, the implantation process 248 includes forming each of the first source 240, the first drain 242, the second source 244 and the second drain 246 with a P-type and with an implantation energy from 7 keV to 25 keV.

Optionally, at least one dielectric layer may be formed to cover the portion 238 of the hard mask layer 220, the first spacer 230 and the second spacer 234 using, for example, a deposition technique. In some examples, as shown in FIG. 2E, the at least one dielectric layer includes dielectric layers 264, 266 and 268 stacked on the surface 202 of the substrate 200 in sequence. In addition, an interconnection layer 254 may be optionally formed in the dielectric layers 264, 266 and 268 and may be electrically connected to the logic gate structure 206, the photosensitive gate structure 208, the first source 240, the first drain 242, the second source 244 and the second drain 246 after passing through the hard mask layer 220. In some examples, as shown in FIG. 2E, the interconnection layer 254 is formed to form to include various contacts 256, various connection layers 258, various vias 260 and various connection layers 262.

In some exemplary examples, the dielectric layer 264 is formed to overlie and cover the hard mask layer 220, the first spacer 230 and the second spacer 234. The contacts 256 are formed in the dielectric layer 256 and passing through the dielectric layer 256 and the hard mask layer 220 to electrically connect to the gate electrode 214, the first source 240 and the first drain 242 of the logic device 250, and the gate electrode 218, the second source 244 and the second drain 246 of the photosensitive device 252 respectively. The contacts 256 may be formed using a damascene technique. Next, the dielectric layer 266 is formed to overlie and cover the dielectric layer 264 and the contacts 256. Then, the connection layers 258 are formed in the dielectric layer 266 and passing through the dielectric layer 266 to electrically connect to the contacts 256 correspondingly using, for example, a damascene technique. The dielectric layer 268 is formed to overlie and cover the dielectric layer 266 and the connection layers 258. Subsequently, the vias 260 and the connection layers 262, which are corresponding to each other, are formed in the dielectric layer 268 using, for example, a dual damascene technique. Combinations of the connection layers 262 and the vias 260 pass through the dielectric layer 268, in which the connection layers 262 overlie the connection layers 258, and the vias 260 connect the connection layers 262 and 258.

In accordance with an embodiment, the present disclosure discloses a semiconductor device. The semiconductor device includes a substrate, a logic gate structure, a photosensitive gate structure, a hard mask layer, a first spacer, a first source, a first drain, a second spacer, a second source and a second drain. The logic gate structure is disposed on a surface of the substrate. The photosensitive gate structure is disposed on the surface of the substrate. The hard mask layer covers the logic gate structure, the photosensitive gate structure and the surface of the substrate. The first spacer overlies the hard mask layer conformal to a sidewall of the logic gate structure. The first source and the first drain are respectively disposed in the substrate at two opposite sides of the logic gate structure. The second spacer overlies the hard mask layer conformal to a sidewall of the photosensitive gate structure. The second source and the second drain are respectively disposed in the substrate at two opposite sides of the photosensitive gate structure.

In accordance with another embodiment, the present disclosure discloses a method for manufacturing a semiconductor device. In this method, a substrate is provided. A logic gate structure and a photosensitive gate structure are formed on a surface of the substrate. A hard mask layer is formed to cover the logic gate structure, the photosensitive gate structure and the surface of the substrate. A spacer material layer is formed to cover the hard mask layer. A portion of the spacer material layer is removed to expose a portion of the hard mask layer, in which the other portion of the spacer material layer remains for forming a first spacer overlying the hard mask layer conformal to a sidewall of the logic gate structure and a second spacer overlying the hard mask layer conformal to a sidewall of the photosensitive gate structure. A first source and a first drain are respectively formed in the substrate at two opposite sides of the logic gate structure, and a second source and a second drain are respectively formed in the substrate at two opposite sides of the photosensitive gate structure.

In accordance with yet another embodiment, the present disclosure discloses a method for manufacturing a semiconductor device. In this method, a substrate is provided. A logic gate structure and a photosensitive gate structure are formed on a surface of the substrate. A multi-layered structure is formed to cover the logic gate structure, the photosensitive gate structure and the surface of the substrate, in which the multi-layered structure includes a bottom layer, an intermediate layer and a top layer stacked on the surface of the substrate in sequence. A portion of the top layer and a portion of the intermediate layer are removed to expose a portion of the bottom layer and to form a first spacer overlying the bottom layer conformal to a sidewall of the logic gate structure and a second spacer overlying the bottom layer conformal to a sidewall of the photosensitive gate structure. A first source and a first drain are respectively formed in the substrate at two opposite sides of the logic gate structure, and a second source and a second drain are respectively formed in the substrate at two opposite sides of the photosensitive gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    providing a substrate;
    forming a logic gate structure and a photosensitive gate structure on a surface of the substrate;
    forming a hard mask layer to cover the logic gate structure, the photosensitive gate structure and the surface of the substrate;
    forming a spacer material layer to cover the hard mask layer;
    removing a first portion of the spacer material layer to expose a portion of the hard mask layer, wherein a second portion of the spacer material layer remains for forming a first spacer overlying the hard mask layer conformal to a sidewall of the logic gate structure and a second spacer overlying the hard mask layer conformal to a sidewall of the photosensitive gate structure; and
    forming a first source and a first drain respectively in the substrate at two opposite sides of the logic gate structure, and a second source and a second drain respectively in the substrate at two opposite sides of the photosensitive gate structure.

2. The method of claim 1, wherein the hard mask layer is formed from silicon dioxide.

3. The method of claim 1, wherein forming the spacer material layer comprises forming the spacer material layer from silicon nitride.

4. The method of claim 1, wherein forming the spacer material layer comprises forming the spacer material layer comprising a stacked structure, wherein the stacked structure comprises a silicon nitride layer on the hard mask layer and a silicon dioxide layer stacked on the silicon nitride layer.

5. The method of claim 4, wherein forming the hard mask layer comprises forming the hard mask layer from silicon dioxide.

6. The method of claim 1, wherein forming the first source, the first drain, the second source and the second drain comprises forming each of the first source, the first drain, the second source and the second drain with an N-type.

7. The method of claim 6, wherein forming the first source, the first drain, the second source and the second drain is performed using an implantation process with an implantation energy from 20 keV to 40 keV.

8. The method of claim 1, wherein forming the first source, the first drain, the second source and the second drain comprises forming each of the first source, the first drain, the second source and the second drain with a P-type.

9. The method of claim 8, wherein forming the first source, the first drain, the second source and the second drain is performed using an implantation process with an implantation energy from 7 keV to 25 keV.

10. The method of claim 8, wherein after forming the first source, the first drain, the second source and the second drain, the method further comprises:
    forming a dielectric layer to cover the portion of the hard mask layer, the first spacer and the second spacer; and
    forming an interconnection layer within the dielectric layer to electrically connect to the logic gate structure, the photosensitive gate structure, the first source, the first drain, the second source and the second drain by passing through the hard mask layer.

11. A method for manufacturing a semiconductor device, the method comprising:

providing a substrate;

forming a logic gate structure and a photosensitive gate structure on a surface of the substrate;

forming a multi-layered structure to cover the logic gate structure, the photosensitive gate structure and the surface of the substrate, wherein the multi-layered structure comprises a bottom layer, an intermediate layer and a top layer stacked on the surface of the substrate in sequence;

removing a portion of the top layer and a portion of the intermediate layer to expose a portion of the bottom layer and to form a first spacer overlying the bottom layer conformal to a sidewall of the logic gate structure and a second spacer overlying the bottom layer conformal to a sidewall of the photosensitive gate structure; and forming a first source and a first drain respectively in the substrate at two opposite sides of the logic gate structure, and a second source and a second drain respectively disposed in the substrate at two opposite sides of the photosensitive gate structure.

12. The method of claim 11, wherein forming the multi-layered structure comprises forming the bottom layer and the top layer from silicon dioxide, and forming the intermediate layer from silicon nitride.

13. The method of claim 11, wherein forming the first source, the first drain, the second source and the second drain comprises:

forming each of the first source, the first drain, the second source and the second drain with an N-type; and using an implantation process with an implantation energy from 20 keV to 40 keV.

14. The method of claim 11, wherein forming the first source, the first drain, the second source and the second drain comprises:

forming each of the first source, the first drain, the second source and the second drain with a P-type; and using an implantation process with an implantation energy from 7 keV to 25 keV.

15. The method of claim 1, wherein providing the substrate comprises providing the substrate with at least one isolation structure which is formed in the substrate and extends from the surface of the substrate.

16. The method of claim 1, wherein forming the logic gate structure and the photosensitive gate structure comprises, for each of the logic gate structure and the photosensitive gate structure, forming a gate dielectric layer on the surface of the substrate and a gate electrode stacked on the gate dielectric layer.

17. The method of claim 1, wherein the hard mask layer is formed to have a thickness which is 190 angstroms.

18. The method of claim 11, wherein providing the substrate comprises providing the substrate with at least one isolation structure which is formed in the substrate and extends from the surface of the substrate.

19. The method of claim 11, wherein forming the logic gate structure and the photosensitive gate structure comprises, for each of the logic gate structure and the photosensitive gate structure, forming a gate dielectric layer on the surface of the substrate and a gate electrode stacked on the gate dielectric layer.

20. The method of claim 11, wherein the bottom layer is formed to have a thickness which is 190 angstroms.

* * * * *